United States Patent
Guo

(10) Patent No.: US 11,075,359 B2
(45) Date of Patent: Jul. 27, 2021

(54) DISPLAY PANEL AND FABRICATION METHOD THEREOF

(71) Applicant: Wuhan Tianma Micro-Electronics Co., Ltd., Wuhan (CN)

(72) Inventor: Linshan Guo, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 6 days.

(21) Appl. No.: 16/557,527

(22) Filed: Aug. 30, 2019

(65) Prior Publication Data
US 2020/0350511 A1 Nov. 5, 2020

(30) Foreign Application Priority Data
Apr. 30, 2019 (CN) .......................... 201910361334.4

(51) Int. Cl.
 *H01L 51/52* (2006.01)
 *H01L 51/56* (2006.01)
 *H01L 27/32* (2006.01)
(52) U.S. Cl.
 CPC .......... *H01L 51/5253* (2013.01); *H01L 51/56* (2013.01); *H01L 27/3276* (2013.01); *H01L 2251/5338* (2013.01)

(58) Field of Classification Search
 CPC ... H01L 51/52; H01L 51/525; H01L 51/5253; H01L 51/56; H01L 27/32; H01L 27/323; H01L 27/3276
 USPC ........................................................ 257/100
 See application file for complete search history.

(56) References Cited

FOREIGN PATENT DOCUMENTS

CN 108336023 A 7/2018

*Primary Examiner* — Fazli Erdem
(74) *Attorney, Agent, or Firm* — Anova Law Group PLLC

(57) ABSTRACT

A display panel and a fabrication method for forming the display panel are provided. The fabrication method includes providing a substrate disposed with a light-emitting device, and forming a first inorganic material layer. The fabrication method also includes forming a first inorganic layer by thinning the first inorganic material layer, and forming a second inorganic layer. Moreover, the fabrication method includes forming a third layer. The third layer is disposed in a first region. Further, the fabrication method includes patterning the first inorganic layer and the second inorganic layer by a dry etching using the third layer as a mask, while simultaneously thinning the third layer. The first inorganic layer and the second inorganic layer in the first region are retained to form a first inorganic encapsulation layer and a second inorganic encapsulation layer, respectively. The third layer is thinned to form a third encapsulation layer.

15 Claims, 10 Drawing Sheets

S10:

S20:

S30:

S40:

S50:

DISPLAY PANEL AND FABRICATION METHOD THEREOF

CROSS-REFERENCES TO RELATED APPLICATIONS

This application claims the priority of Chinese patent application No. 201910361334.4, filed on Apr. 30, 2019, the entirety of which is incorporated herein by reference.

FIELD

The present disclosure generally relates to the field of display technology and, more particularly, relates to a display panel and a fabrication method thereof.

BACKGROUND

Since the emergence of display technology, the display technology has developed very rapidly. Cathode ray tube technology (CRT), plasma display panel technology (PDP), liquid crystal display (LCD), and the latest organic light-emitting display technology (OLED) as well as micro light-emitting diode technology (micro LED) have emerged successively.

With the development of society and the continuous improvement of human's material life needs, current display technology is developing fast toward narrow frame, high contrast, high resolution, full color display, low power consumption, high reliability, long life, thin and light. The research on flexible display screen (soft screen) technology is constantly improving and deepening. In contrast to conventional flat panel display, when the display panel uses a flexible material as a substrate, flexible display can be implemented, and, thus, a fantastic visual effect can be built. With its bendability, the flexible display panel can be applied in many fields, e.g., a rollable display device, a flexible wearable device, and a foldable display device, etc.

In a conventional flexible display screen, the display screen is packaged using a thin film encapsulation technology. In a conventional encapsulation layer formed by the thin film encapsulation technology, a thickness of the inorganic encapsulation layer is substantially large, approximately 1 μm, and cracks appeared during the bending process constitute a water-oxygen invasion path, which will cause failure of encapsulation and reduce quality and reliability of the display screen. The disclosed display panel and fabrication method are directed to solve one or more problems set forth above and other problems.

SUMMARY

One aspect of the present disclosure provides a fabrication method for forming a display panel. The fabrication method includes providing a substrate disposed with a light-emitting device, and forming a first inorganic material layer. The fabrication method also includes forming a first inorganic layer by thinning the first inorganic material layer, and forming a second inorganic layer. Moreover, the fabrication method includes forming a third layer. The third layer is disposed in a first region. Further, the fabrication method includes patterning the first inorganic layer and the second inorganic layer by a dry etching using the third layer as a mask, while simultaneously thinning the third layer. The first inorganic layer in the first region is retained to form a first inorganic encapsulation layer. The second inorganic layer in the first region is retained to form a second inorganic encapsulation layer. The third layer is thinned to form a third encapsulation layer.

Another aspect of the present disclosure provides a display panel. The display panel includes a substrate provided with a light-emitting device, and a first inorganic encapsulation layer disposed on a side of the light-emitting device. A region where the first inorganic encapsulation layer is located defines a first region. The display panel also includes a second inorganic encapsulation layer disposed on a side of the first inorganic encapsulation layer away from the light-emitting device. The second inorganic encapsulation layer is disposed in the first region. Further, the display panel includes a third encapsulation layer disposed on a side of the second inorganic encapsulation layer away from the light-emitting device. The third encapsulation layer is disposed in the first region. A vertical cross-section of the third encapsulation layer includes an arc-shaped slope, and an end of the arc-shaped slope is coplanar with a boundary of the first region. Along a direction oriented from the boundary of the first region to inside of the first region, a thickness of the third encapsulation layer in the location of the arc-shaped slope gradually increases.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE INVENTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
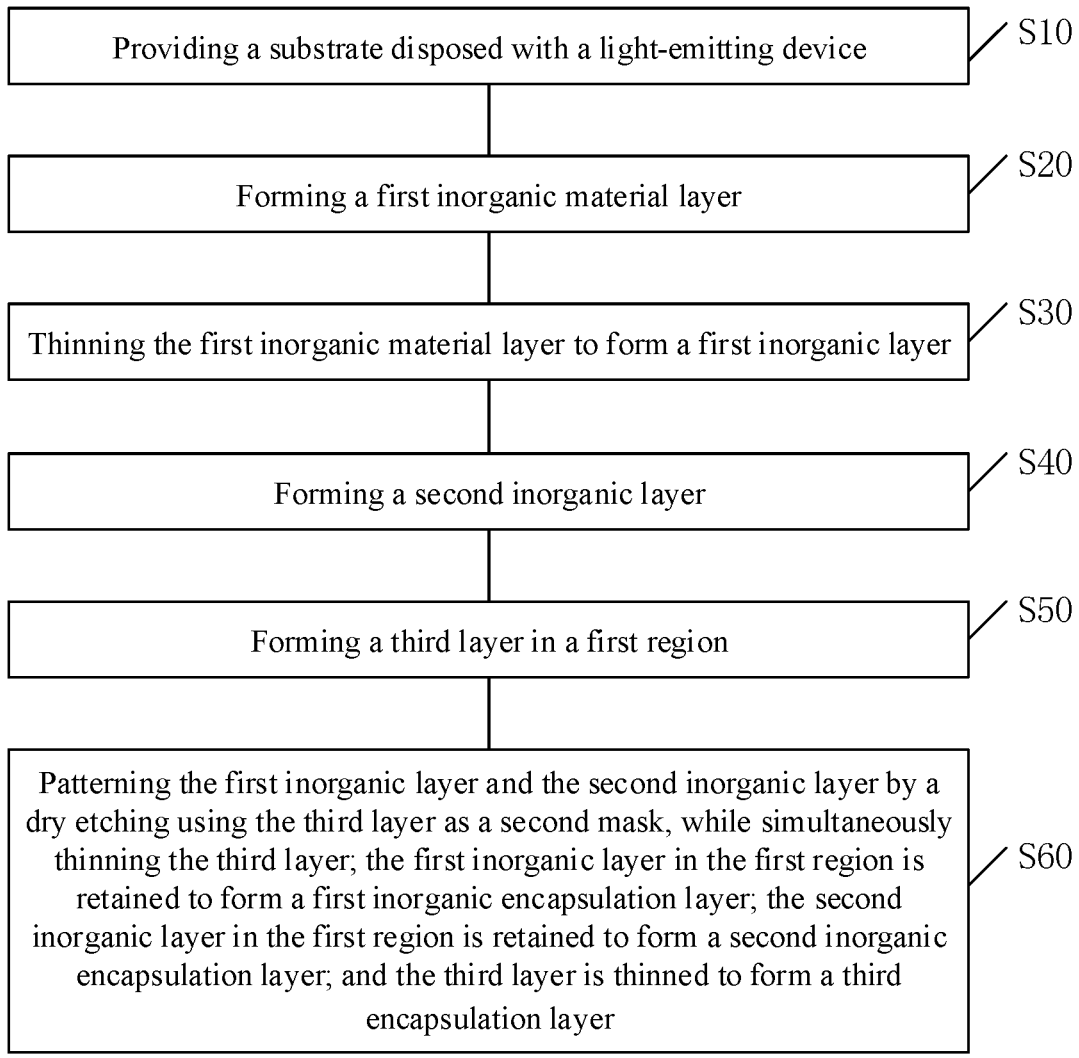
FIG. 1 illustrates a flow chart of an exemplary fabrication method for forming a display panel consistent with disclosed embodiments of the present disclosure.
Figure 2:
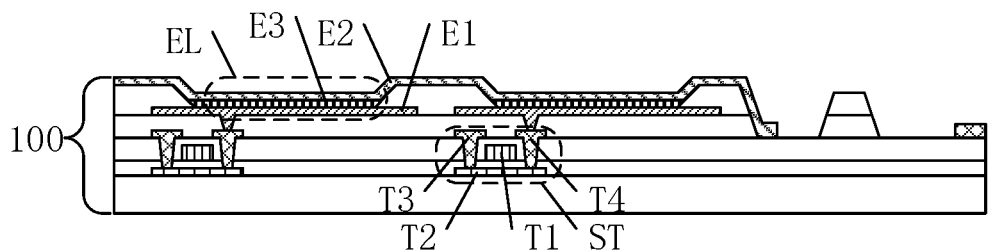
FIGS. 2-7 illustrate schematic sectional views of semiconductor structures corresponding to certain stages of an exemplary fabrication method for forming a display panel in FIG. 1 consistent with disclosed embodiments of the present disclosure.
Figure 3:
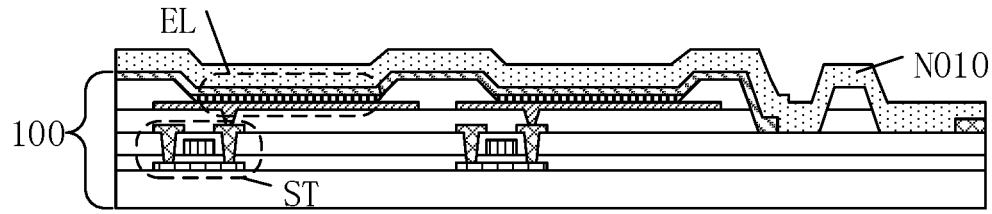
Figure 4:
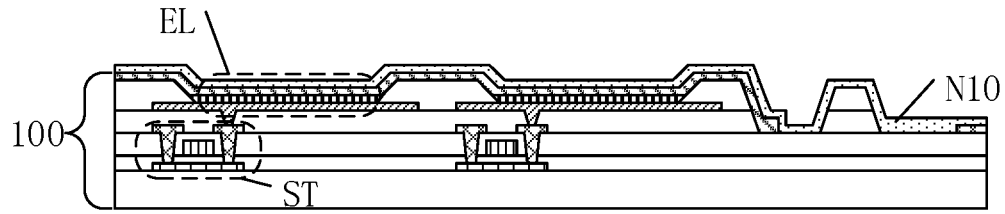
Figure 5:
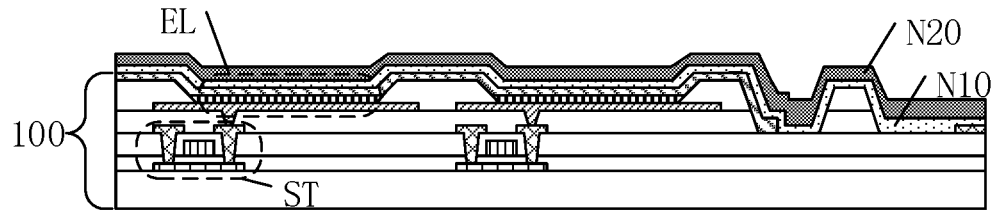
Figure 6:
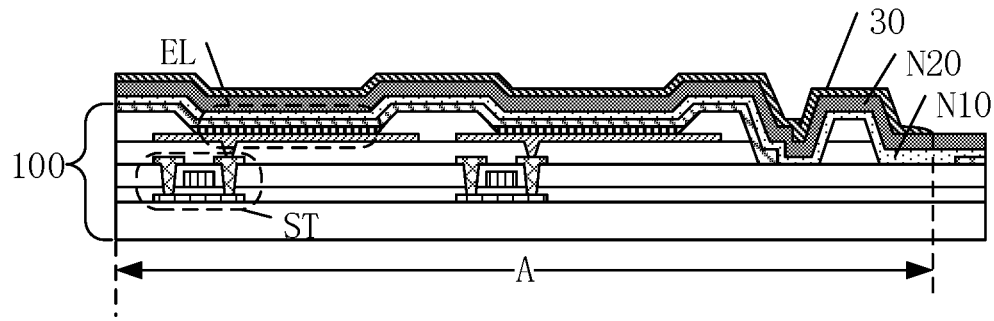

The present disclosure provides a fabrication method for forming a display panel. FIG. 1 illustrates a flow chart of a fabrication method for forming a display panel consistent with disclosed embodiments of the present disclosure; and FIGS. 2-7 illustrate schematic sectional views of semiconductor structures corresponding to certain stages of the fabrication method for forming a display panel in FIG. 1. The disclosed fabrication method for forming a display panel may include the following.

S10: Providing a substrate 100 disposed with a light-emitting device EL.

S20: Forming a first inorganic material layer N010.

S30: Thinning the first inorganic material layer N010 to form a first inorganic layer N10.

S40: Forming a second inorganic layer N20.

S50: Forming a third layer 30 in a first region A.

S60: Patterning the first inorganic layer N10 and the second inorganic layer N20 by a dry etching using the third layer 30 as a second mask, while simultaneously thinning the third layer 30. The first inorganic layer N10 in the first region A may be retained to form a first inorganic encapsulation layer N1. The second inorganic layer N20 in the first region A may be retained to form a second inorganic encapsulation layer N2. The third layer 30 may be thinned to form a third encapsulation layer F3.

The substrate 100 provided in S10 may include the light-emitting device EL. The light-emitting device EL may emit light after receiving a suitable electrical signal. In one embodiment, the light-emitting device EL may be an organic light-emitting diode comprising an anode E1, a cathode E2 and a light-emitting material layer E3.

In one embodiment, the light emitted from the light-emitting device EL in the substrate 100 may have a same color or a different color, which is not limited by the present disclosure.

The substrate 100 provided in S10 may further include a thin film transistor ST. The thin film transistor ST may include a gate T1, an active layer T2, a source T3, and a drain T4. The thin film transistor ST may be used as a switch device. The drain T4 may be electrically connected to the anode E1 of the light-emitting device EL for transmitting an electrical signal to the light-emitting device EL.

In one embodiment, the first inorganic material layer N010 in S20 may be formed using a low temperature chemical vapor deposition (LT-CVD) technique. In one embodiment, the first inorganic material layer N010 may be made of silicon nitride, silicon oxide, or a mixture of silicon nitride and silicon oxide, which is not limited by the present disclosure.

The first inorganic material layer N010 may be thinned to form the first inorganic layer N10 in S30. The thinning process may include performing a full-surface etching on the first inorganic material layer N010. In one embodiment, a thickness of the first inorganic material layer N010 may be in a range of approximately 0.1 µm-0.4 µm, and a thickness of the thinned first inorganic layer N10 may be less than 0.1 µm.

In one embodiment, the second inorganic layer N20 may be formed using a low temperature atomic layer deposition (LT-ALD) technique. In one embodiment, a thickness of the second inorganic layer N20 may be in a range of approximately 30 nm-50 nm. In one embodiment, the second inorganic layer N20 may be made of alumina.

The third layer 30 may be formed in S50. The third layer 30 may be made of an organic material, or an inorganic material, which is not limited by the present disclosure. The third layer 30 may be formed in the first region A. The first region A may have an area smaller than the region where the first inorganic layer N10 is located, and the first region A may have an area smaller than the region where the second inorganic layer N20 is located.

The first inorganic layer N10 and the second inorganic layer N20 may be patterned by a dry etching using the third layer 30 as the second mask in S60. The first inorganic layer N10 and the second inorganic layer N20 in the first region A may be retained.

In S60, because the etching gas also has an etching effect on the third layer 30, the third layer 30 may be uniformly etched, such that the etching gas may have a thinning effect on the third layer 30. After thinning the third layer 30, the third encapsulation layer F3 may be formed.

The first inorganic encapsulation layer N1, the second inorganic encapsulation layer N2, and the third encapsulation layer F3 may package and protect the light-emitting device EL to prevent substances, e.g., water, oxygen and impurities outside the display panel from eroding the light-emitting device EL. In one embodiment, the light-emitting device EL may be disposed in the first region A.

In one embodiment, a pad P may be disposed in a region outside the first region A, and the pad P may be electrically connected to an electronic component (not illustrated) outside the display panel. The first inorganic encapsulation layer N1, the second inorganic encapsulation layer N2, and the third encapsulation layer F3 may be disposed in the first region A to prevent the pad P from being covered by each of the above three encapsulation layers. Therefore, the electronic component provided in subsequent process may be in smooth contact with and electrically connected to the pad P.

In the disclosed fabrication method, on the one hand, the first inorganic material layer N010 may be first thinned to form the first inorganic layer N10. The substantially thin first inorganic layer N10 may facilitate improving the bending property thereof and preventing the appearance of cracks.

On the other hand, the third layer 30 may be formed in the first region A. The first inorganic layer N10 and the second inorganic layer N20 may be etched using the third layer 30 as the second mask. The first inorganic layer N10 in the first region A may be retained to form the first inorganic encapsulation layer N1. The second inorganic layer N20 in the first region A may be retained to form the second inorganic encapsulation layer N2. Thus, the quantity of masks may be saved, which may facilitate reducing cost.

Further, on the other hand, while patterning the first inorganic layer N10 and the second inorganic layer N20 by the dry etching, the third layer 30 may be thinned by the etching gas. After thinning the third layer 30, the third encapsulation layer F3 may be formed. The substantially thin third encapsulation layer F3 may facilitate improving the bending property thereof and preventing the appearance of cracks.

In the disclosed display panel, the thickness of each encapsulation layer may be substantially thin, such that the display panel may have desired bending resistance, and the display quality and reliability may be improved.

In the disclosed fabrication method, the etching technique may be a wet etching or a dry etching unless otherwise specified. When the wet etching is used, different etching liquids may be used according to different material of each layer. When the dry etching is used, different etching gas may be used according to different material of each layer. The etching liquid and the etching gas are not limited by the present disclosure.

In the disclosed fabrication method, the third layer formed in S50 may be made of an organic material, or an inorganic material. The material and fabrication method of an exemplary third layer and the detailed structure of the encapsulation layer may be described in detail in the following.

Figure 8:
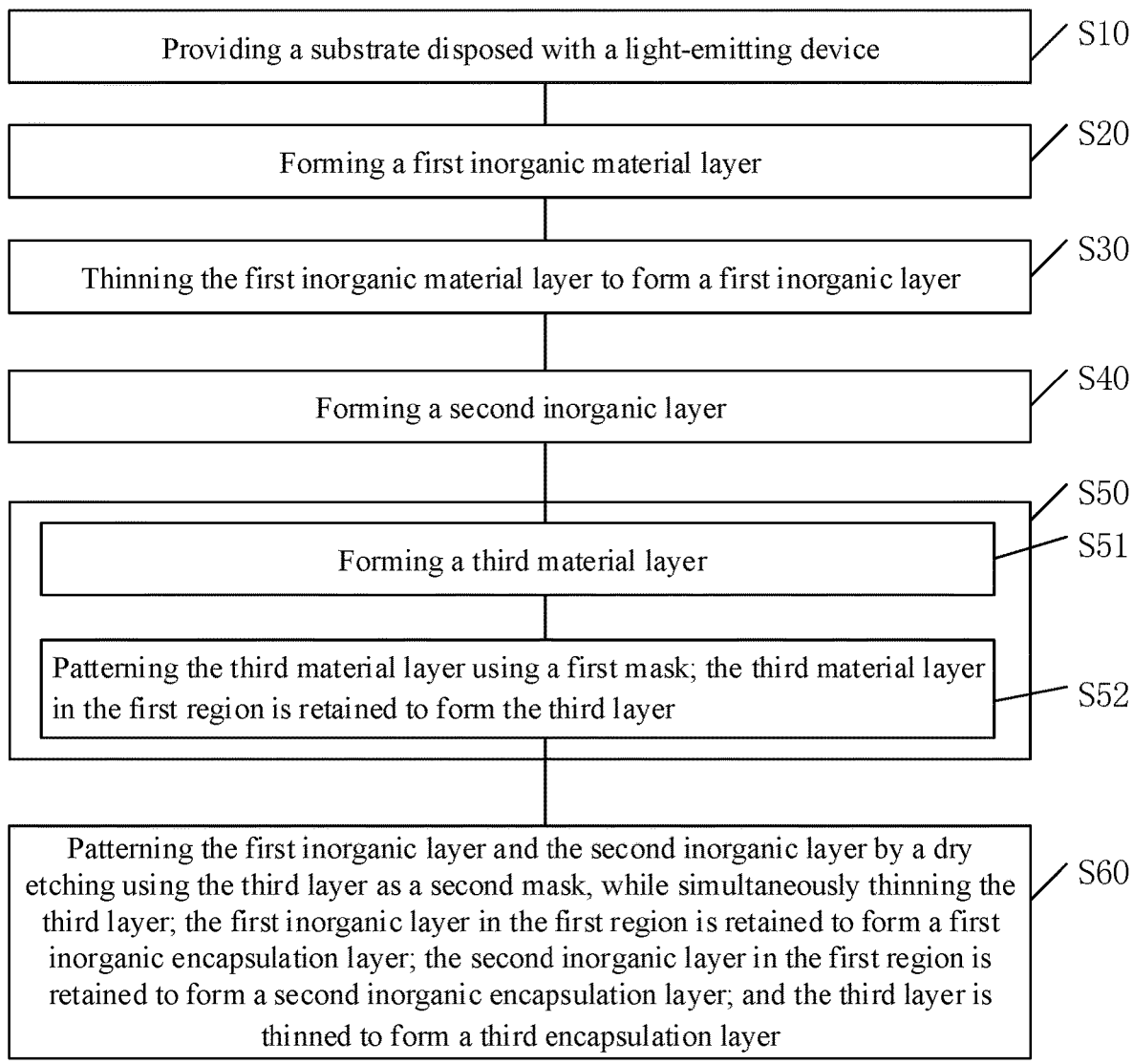
FIG. 8 illustrates a flow chart of another exemplary fabrication method for forming a display panel consistent with disclosed embodiments of the present disclosure.
Figure 9:
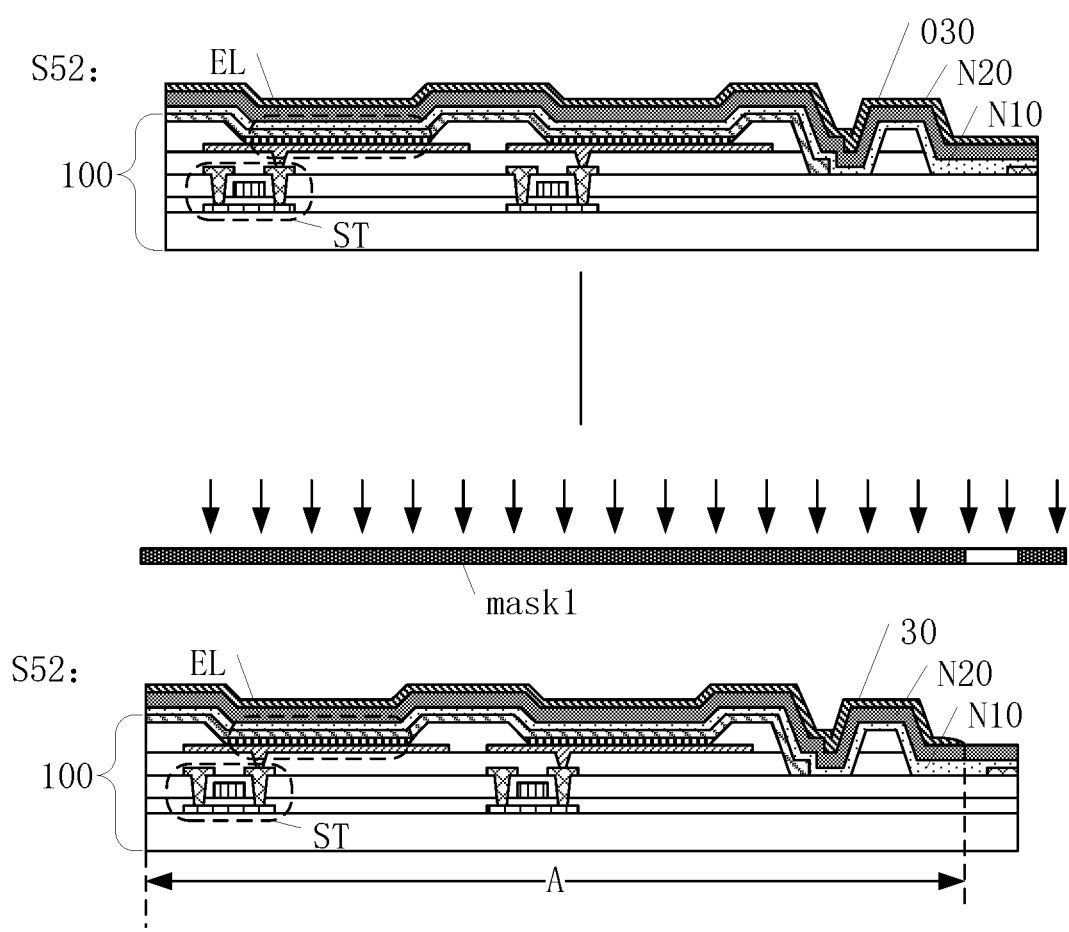
FIG. 9 illustrates schematic sectional views of semiconductor structures corresponding to S51 and S52 of an exemplary fabrication method for forming a display panel in FIG. 8 consistent with disclosed embodiments of the present disclosure.

FIG. 8 illustrates a flow chart of another fabrication method for forming a display panel consistent with disclosed embodiments of the present disclosure; and FIG. 9 illustrates schematic sectional views of semiconductor structures corresponding to S51 and S52 of the fabrication method for forming a display panel in FIG. 8. In certain embodiments, referring to FIG. 8 and FIG. 9, the third layer 30 may be made of an inorganic material. In one embodiment, forming the third layer 30 in S50 may further include the following.

S51: Forming a third material layer 030.

S52: Patterning the third material layer 030 using a first mask mask1. The third material layer 030 in the first region A may be retained to form the third layer 30.

In one embodiment, the third material layer 030 may be formed using a low temperature chemical vapor deposition (LT-CVD) technique. In one embodiment, the third material layer 030 may be made of silicon oxynitride, which is not limited by the present disclosure.

Correspondingly, the third encapsulation layer formed by thinning the third layer 30 in S50 may be made of an inorganic material. In one embodiment, a thickness of the third layer 30 may be in a range of approximately 0.4 μm-1 μm, and a thickness of the thinned third encapsulation layer may be in a range of approximately 0.05 μm-0.3 μm.

The patterning process in S52 may further include coating a photoresist on the third material layer 030. The photoresist may be a positive photoresist, or a negative photoresist. A different mask may be selected according to different nature of the photoresist.

In one embodiment, for illustrative purposes, a positive photoresist is used as an example. Correspondingly, the first mask mask1 may be opaque in a region corresponding to the first region A, and may be transparent in a region outside the first region A. After being illuminated under light, the display panel may be rinsed with a developer. The third material layer 030 in the first region A may be retained to form the third layer 30. The third material layer 030 outside the first region A may be etched away.

Figure 7:
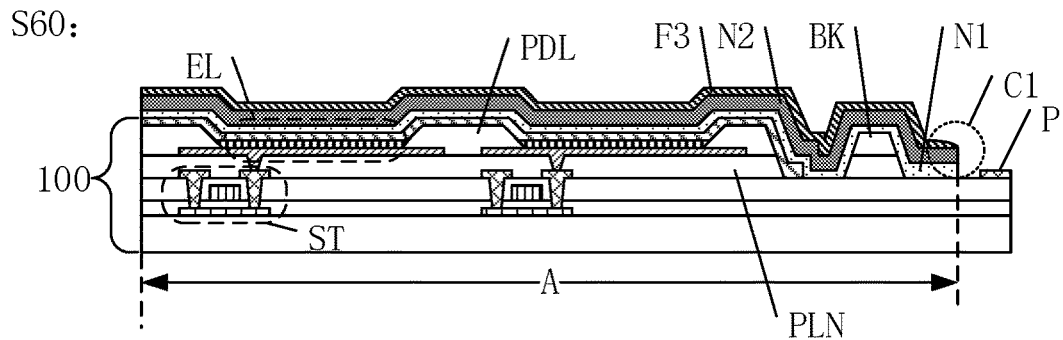

FIG. 7 illustrates a structure of a display panel formed by the disclosed fabrication method. The encapsulation layer of the display panel may include three layers of stacked inorganic layers, including a first inorganic encapsulation layer N1, a second inorganic encapsulation layer N2, and a third encapsulation layer F3. In the display panel formed by the disclosed fabrication method, the first inorganic encapsulation layer N1 and the third encapsulation layer F3 may be formed after performing a thinning treatment, and, thus, the overall thickness of the encapsulation layer may be substantially small. Therefore, the display panel may have desired bending resistance, and the display quality and reliability may be improved.

In the display panel illustrated in FIG. 7, any other suitable film layer structure may be formed on a side of the third encapsulation layer F3 away from the substrate 100 in subsequent fabrication processes. In one embodiment, a touch control function layer (not illustrated) may be formed. The touch control function layer may be used to implement the touch control function. The detailed structure of the touch control function layer is not limited by the present disclosure. The processes after forming the encapsulation layer are not limited by the present disclosure.

Figure 10:
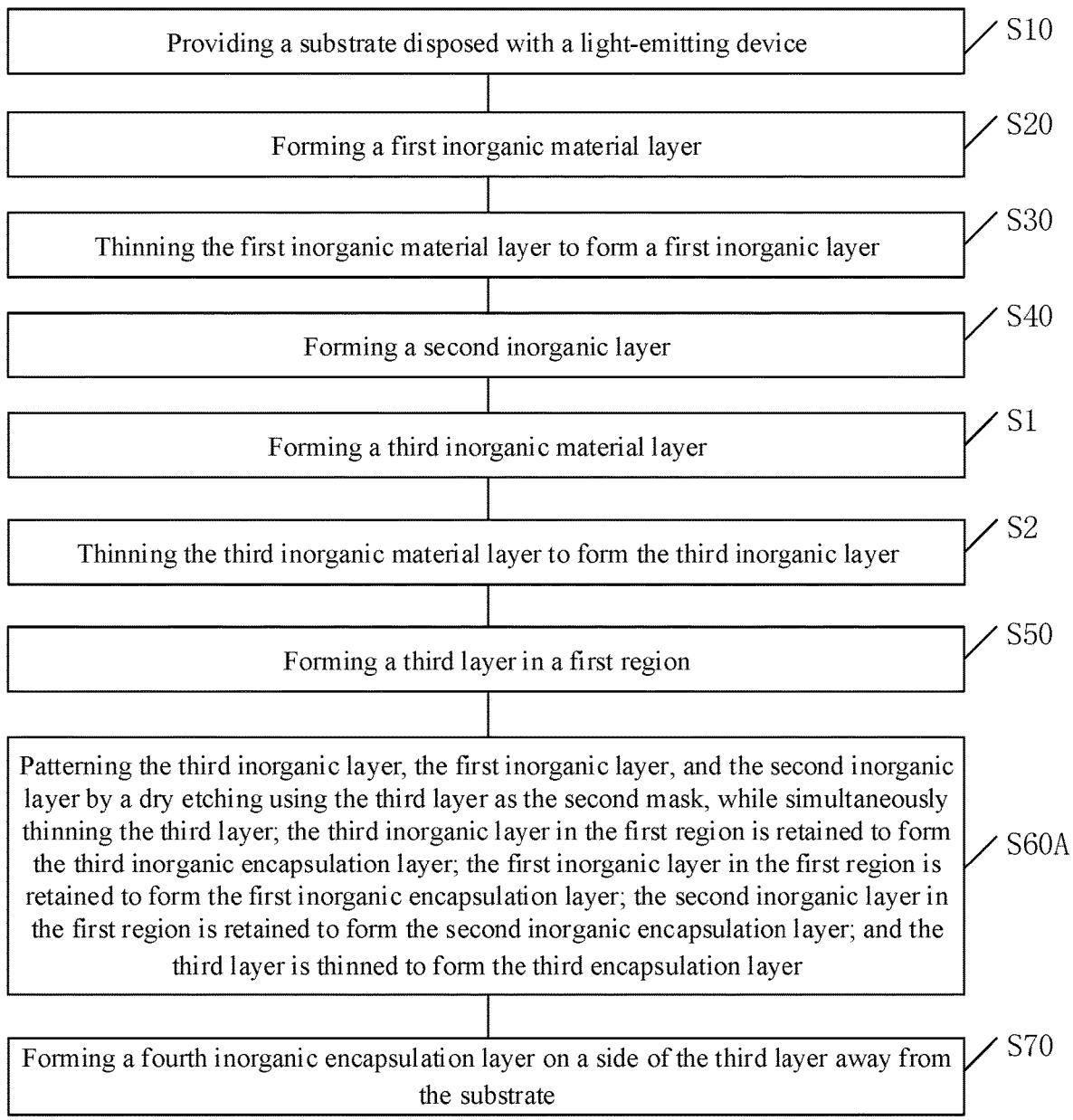
FIG. 10 illustrates a flow chart of another exemplary fabrication method for forming a display panel consistent with disclosed embodiments of the present disclosure.
Figure 11:
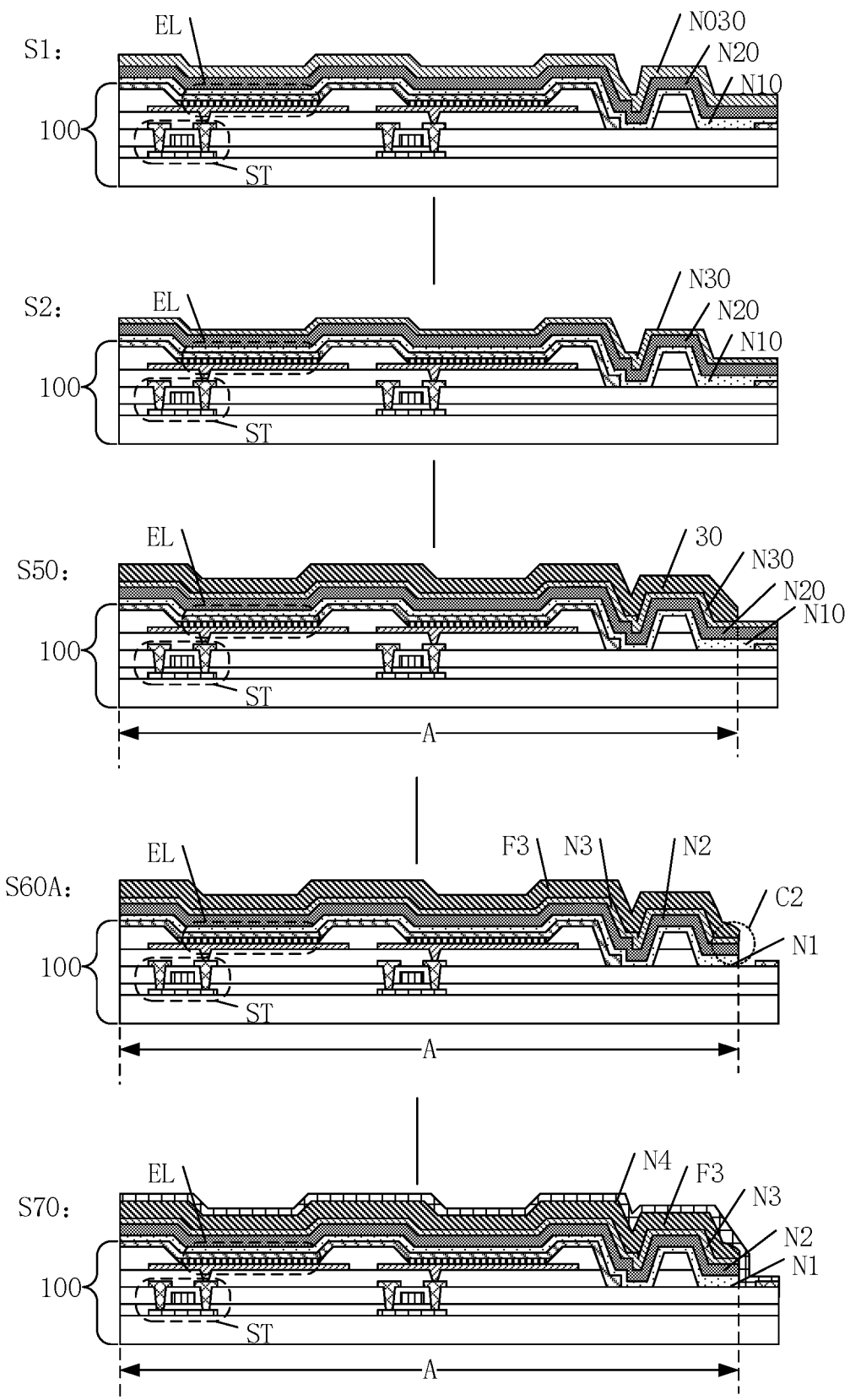
FIG. 11 illustrates schematic sectional views of semiconductor structures corresponding to S1-S70 of an exemplary fabrication method for forming a display panel in FIG. 10 consistent with disclosed embodiments of the present disclosure.

FIG. 10 illustrates a flow chart of another fabrication method for forming a display panel consistent with disclosed embodiments of the present disclosure; and FIG. 11 illustrates schematic sectional views of semiconductor structures corresponding to S1-S70 of the fabrication method for forming a display panel in FIG. 10. In certain embodiments, referring to FIG. 10 and FIG. 11, before forming the third layer 30 in S50, the disclosed fabrication method may further include the following.

S1: Forming a third inorganic material layer N030.

S2: Thinning the third inorganic material layer N030 to form the third inorganic layer N30.

Patterning the first inorganic layer N10 and the second inorganic layer N20 by a dry etching using the third layer 30 as the second mask, while simultaneously thinning the third layer 30 in S60 may further include the following.

S60A: Patterning the third inorganic layer N30, the first inorganic layer N10, and the second inorganic layer N20 by a dry etching using the third layer 30 as the second mask, while simultaneously thinning the third layer 30. The third inorganic layer N30 in the first region A may be retained to form the third inorganic encapsulation layer N3.

In one embodiment, the third inorganic material layer N030 may be formed using a low temperature chemical vapor deposition (LT-CVD) technique. In one embodiment, the third inorganic material layer N030 may be made of silicon nitride, silicon oxide, a mixture of silicon nitride and silicon oxide, or silicon oxynitride, which is not limited by the present disclosure.

In one embodiment, the third layer 30 may be made of an organic material. Forming the third layer 30 may further include printing the organic material in the first region A by inkjet printing to form the third layer 30. The inkjet printing may directly print the organic material in the first region A without using a patterning process, which may facilitate saving the process of the display panel.

When performing the thinning process on the third layer 30, the etching gas may also have an etching effect on the third layer 30, thus, a thinning treatment may be performed on the third layer 30. The third encapsulation layer F3 may be formed after thinning the third layer 30.

In certain embodiments, the third layer 30 may be made of an organic material. The disclosed fabrication method may further include the following.

S70: Forming a fourth inorganic encapsulation layer N4 on a side of the third layer 30 away from the substrate 100. In one embodiment, a thickness of the fourth inorganic encapsulation layer N4 is denoted as d4, where $0.05\ \mu m \leq d4 \leq 0.25\ \mu m$.

A structure of a display panel formed by the disclosed fabrication method may refer to a schematic sectional view of a semiconductor structure corresponding to S70 illustrated in FIG. 11. The encapsulation layer of the display panel may include the first inorganic encapsulation layer N1, the second inorganic encapsulation layer N2, the third inorganic encapsulation layer N3, the third layer 30 made of an organic material, and the fourth inorganic encapsulation layer N4 that are successively stacked. The first inorganic encapsulation layer N1 and the third encapsulation layer F3 may be formed after performing a thinning treatment, which may facilitate reducing the overall thickness of the encapsulation layer.

The third encapsulation layer F3 may be made of an organic material, and may absorb the stress of the organic film layer in the encapsulation layer, which may facilitate improving the bending resistance of the encapsulation layer. The fourth inorganic encapsulation layer N4 may be disposed on the third encapsulation layer F3. The inorganic film layer may have a dense structure, which may effectively block substances, e.g., water, oxygen and impurities, and may further protect the internal structure of the display panel.

In the display panel corresponding to S70 in FIG. 11, any other suitable film layer structure may be formed on a side of the fourth inorganic encapsulation layer N4 away from the substrate 100 in subsequent fabrication processes. In one embodiment, a touch control panel (not illustrated) may be pasted. The touch control panel may be used to implement the touch control function. The detailed structure of the touch control panel is not limited by the present disclosure. The processes after forming the encapsulation layer are not limited by the present disclosure.

Figure 12:
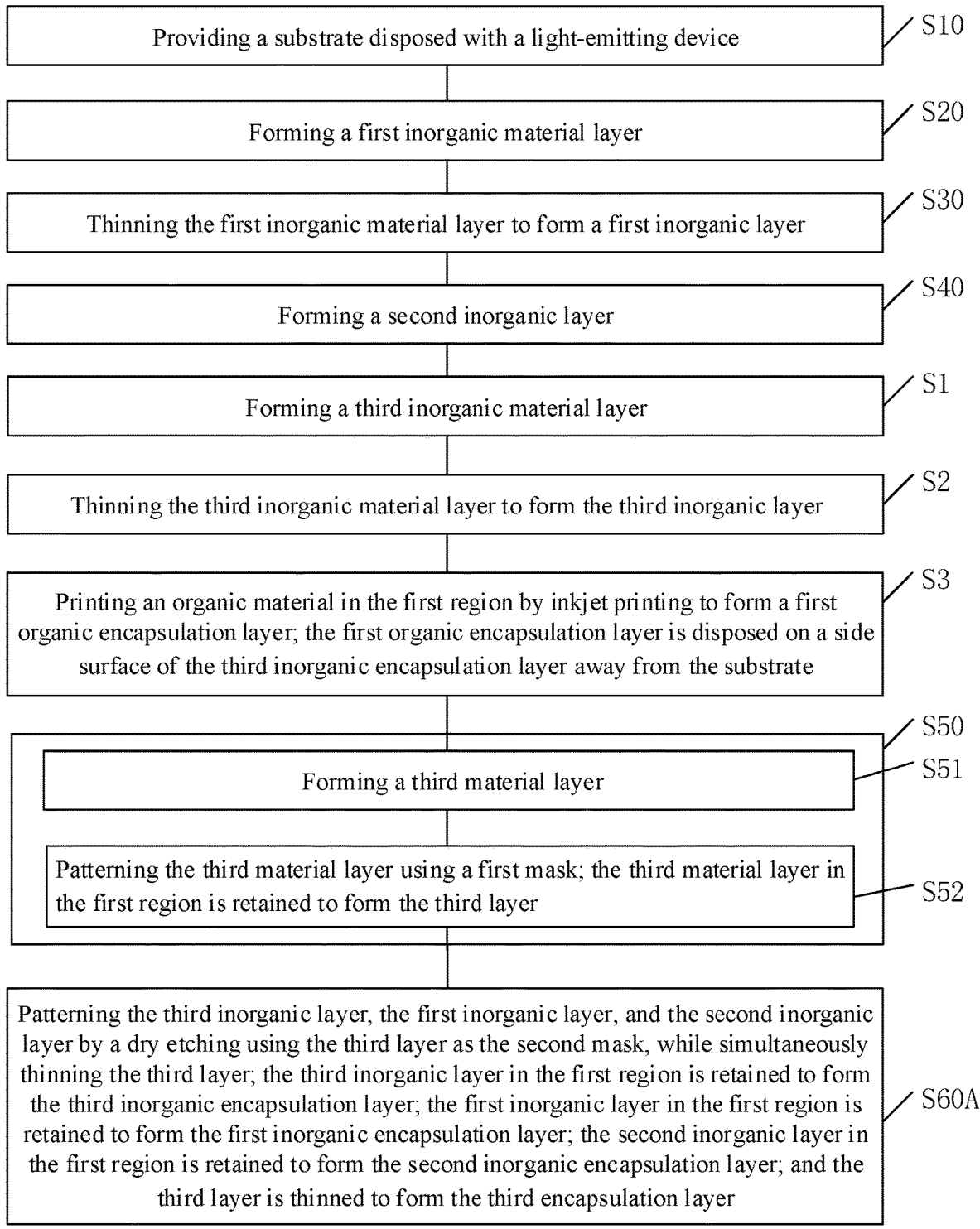
FIG. 12 illustrates a flow chart of another exemplary fabrication method for forming a display panel consistent with disclosed embodiments of the present disclosure.
Figure 13:
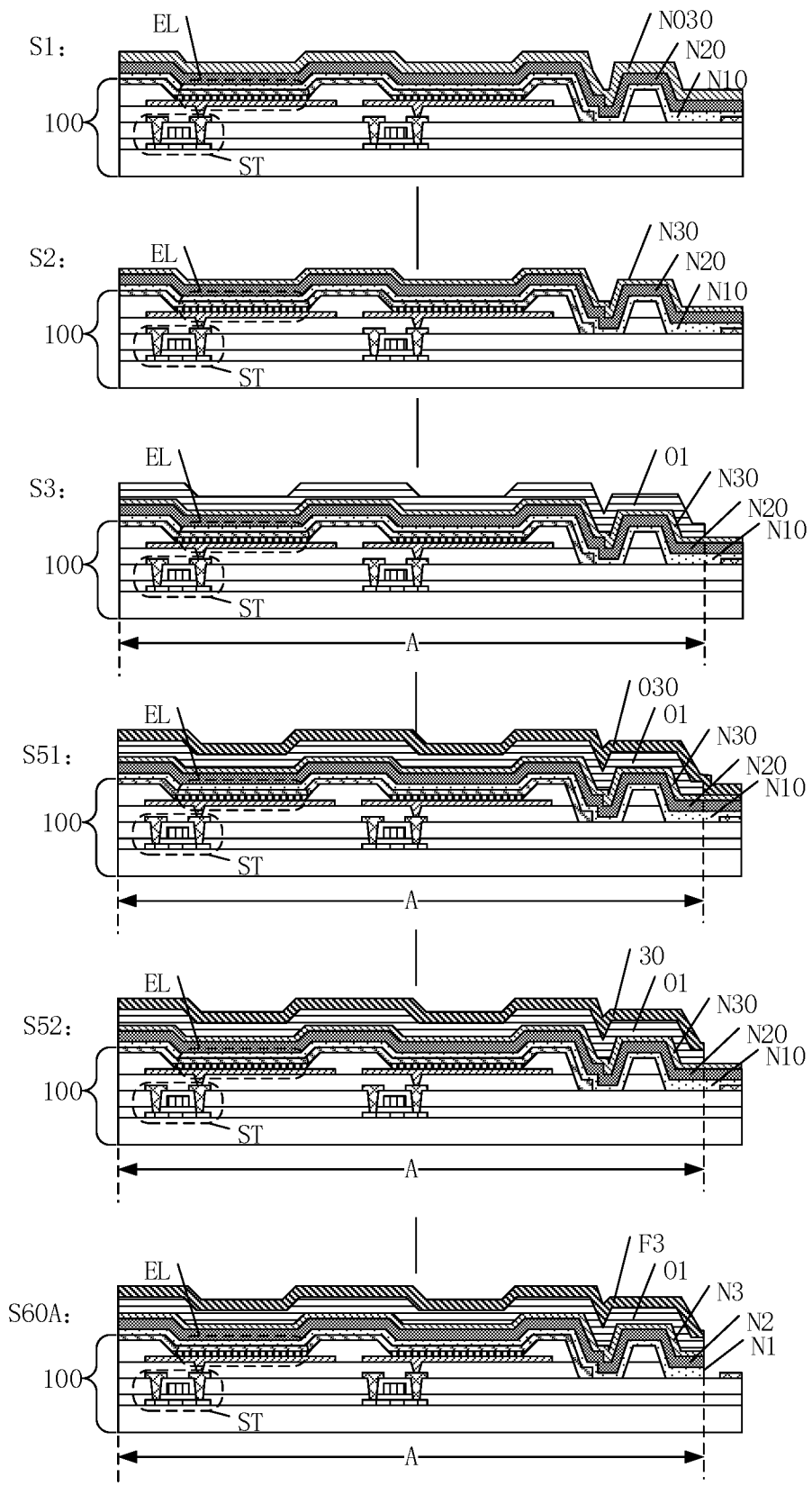
FIG. 13 illustrates schematic sectional views of semiconductor structures corresponding to S1-S60A of an exemplary fabrication method for forming a display panel in FIG. 12 consistent with disclosed embodiments of the present disclosure.

FIG. 12 illustrates a flow chart of another fabrication method for forming a display panel consistent with disclosed embodiments of the present disclosure; and FIG. 13 illustrates schematic sectional views of semiconductor structures corresponding to S1-S60A of the fabrication method for forming a display panel in FIG. 12. In certain embodiments, referring to FIG. 12 and FIG. 13, the third layer 30 may be made of an inorganic material. Before forming the third layer 30 in S50, the disclosed fabrication method may further include the following.

S1: Forming the third inorganic material layer N030.

S2: Thinning the third inorganic material layer N030 to form the third inorganic layer N30.

S3: Printing an organic material in the first region A by inkjet printing to form a first organic encapsulation layer O1. The first organic encapsulation layer O1 may be disposed on a side surface of the third inorganic encapsulation layer N3 away from the substrate 100.

The inkjet printing may directly print the organic material in the first region A to form the first organic encapsulation layer O1 without using a patterning process, which may facilitate saving the process of the display panel.

In one embodiment, forming the third layer 30 in S50 may further include the following.

S51: Forming the third material layer 030.

S52: Patterning the third material layer 030 using the first mask. The third material layer 030 in the first region A may be retained to form the third layer 30.

In one embodiment, patterning the first inorganic layer N10 and the second inorganic layer N20 by a dry etching using the third layer 30 as the second mask, while simultaneously thinning the third layer 30 in S60 may further include the following.

S60A: Patterning the third inorganic layer N30, the first inorganic layer N10, and the second inorganic layer N20 by a dry etching using the third layer 30 as the second mask, while simultaneously thinning the third layer 30. The third inorganic layer N30 in the first region A may be retained to form the third inorganic encapsulation layer N3.

In one embodiment, a thickness of the third encapsulation layer formed by thinning the third layer 30 is denoted as d3, where $0.05\ \mu m \leq d3 \leq 0.1\ \mu m$.

A structure of a display panel formed by the disclosed fabrication method may refer to a schematic sectional view of a semiconductor structure corresponding to S60A illustrated in FIG. 13. The encapsulation layer of the display panel may include the first inorganic encapsulation layer N1, the second inorganic encapsulation layer N2, the third inorganic encapsulation layer N3, the first organic encapsulation layer O1, and the third encapsulation layer F3 that are successively stacked. The first inorganic encapsulation layer N1, the third inorganic encapsulation layer N3, and the third encapsulation layer F3 may be formed after performing a thinning treatment, which may facilitate reducing the overall thickness of the encapsulation layer.

The first organic encapsulation layer O1 may be made of an organic material, and may absorb the stress of the organic film layer in the encapsulation layer, which may facilitate improving the bending resistance of the encapsulation layer. The third encapsulation layer F3 may be disposed on the first organic encapsulation layer O1. The inorganic film layer may have a dense structure, which may effectively block substances, e.g., water, oxygen and impurities, and may further protect the internal structure of the display panel.

The first organic encapsulation layer O1 may be directly formed by printing. Therefore, in certain embodiments, compared to other inorganic encapsulation layers, an edge of the first organic encapsulation layer O1 may be indented. Thus, the inorganic encapsulation layers disposed on upper and lower sides of the first organic encapsulation layer O1 outside the range of the edge of the first organic encapsulation layer O1 may contact each other.

In the display panel corresponding to S60A in FIG. 13, any other suitable film layer structure may be formed on a side of the third encapsulation layer F3 away from the substrate 100 in subsequent fabrication processes. In one embodiment, a touch control panel (not illustrated) may be pasted. The touch control panel may be used to implement the touch control function. The detailed structure of the touch control panel is not limited by the present disclosure. The processes after forming the encapsulation layer are not limited by the present disclosure.

Figure 14:
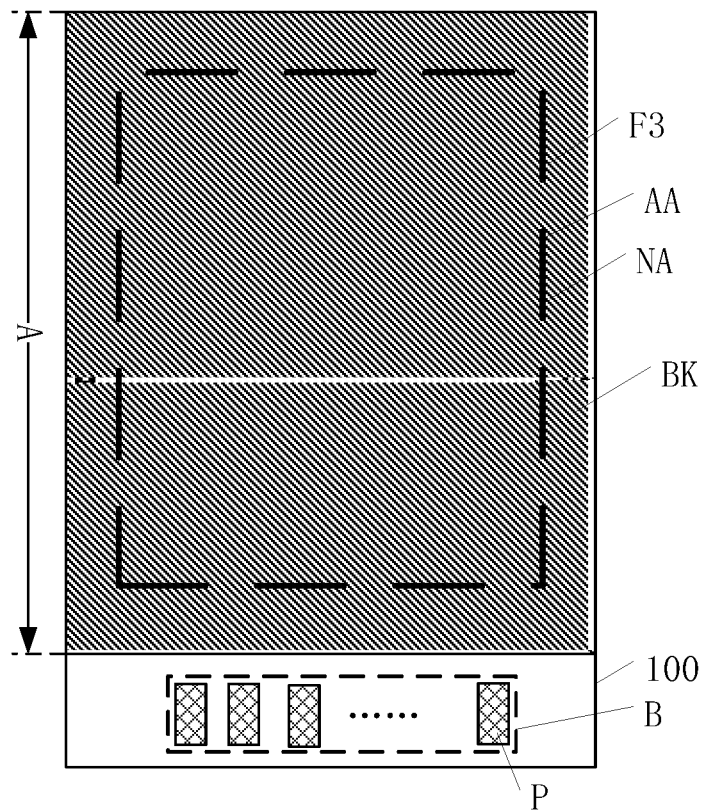
FIG. 14 illustrates a schematic top view of an exemplary display panel formed by a fabrication method in FIG. 1 consistent with disclosed embodiments of the present disclosure.

FIG. 14 illustrates a schematic top view of a display panel formed by a fabrication method in FIG. 1. In one embodiment, referring to FIG. 7 and FIG. 14, the display panel may include a preset display region AA and a non-display region NA. The non-display region NA may include a binding region B. The substrate 100 may further include a plurality of pads P, and the plurality of pads P may be disposed in the binding region B. The binding region B may be disposed outside the first region A.

In the disclosed fabrication method, the display region AA may have an image display function, and the light-emitting device EL may be disposed in the display region AA. The first region A may have an area greater than or equal to the display region AA. The display region AA may be disposed inside the first region A.

The non-display region NA may not have a display function, and may be used for disposing electronic components, circuits, and signal lines, etc. The non-display region NA may include the binding region B, and the binding region B may include the plurality of pads P. In one embodiment, the plurality of pads P may be disposed in a same layer as the source and drain of the thin film transistor ST. In subsequent fabrication processes of the display panel, an electronic component, e.g., a chip or a flexible circuit board, may be electrically connected to a pad P through conductive paste.

In the disclosed fabrication method, the first inorganic layer N10 and the second inorganic layer N20 may be patterned by a dry etching using the third layer 30 as the second mask to form the first inorganic encapsulation layer N1 and the second inorganic encapsulation layer N2. The first inorganic encapsulation layer N1, the second inorganic encapsulation layer N2, and the third encapsulation layer F3 may be disposed in the first region A, to prevent the pad P from being covered by each of the above encapsulation layers. Thus, the electronic components provided in the subsequent processes may be electrically connected to the pad P through conductive paste.

In certain embodiments, referring to FIG. 7 and FIG. 14, the substrate 100 may further include at least one blocking part BK. The blocking part BK may have an annular shape and may be disposed around the light-emitting device EL. The blocking part BK may be disposed inside the first region A.

In one embodiment, a quantity of the blocking parts BK may be two or more, which is not limited by the present disclosure. In one embodiment, a part of the film layer of the blocking part BK may be disposed in a same layer as a planarization layer PLN, and another part of the film layer may be disposed in a same layer as a pixel definition layer PDL.

The blocking part BK may have a closed annular shape and may be disposed around the light-emitting device EL. The blocking part BK may be disposed inside the first region A, and at least a portion of the encapsulation layer may fully cover the blocking part BK. The blocking part BK and the subsequently formed encapsulation layer together may further block substances, e.g., water, oxygen and impurities, etc., from entering the inside of the display panel through the gap of the encapsulation layer. The blocking part BK may improve the waterproof, oxygen-proof and dustproof capability of the display panel.

Figure 15:
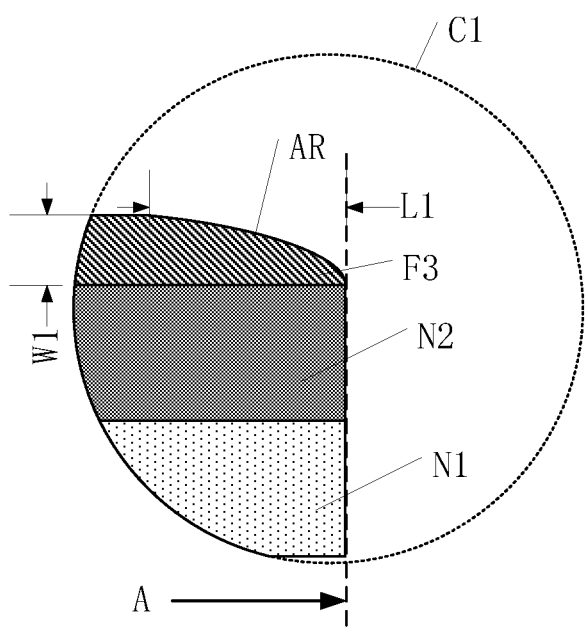
FIG. 15 illustrates an exemplary local zoom-in view of region C1 in FIG. 7 consistent with disclosed embodiments of the present disclosure.

FIG. 15 illustrates a local zoom-in view of region C1 in FIG. 7. In certain embodiments, referring to FIG. 7 and FIG. 15, in the display panel formed by the disclosed fabrication method, a vertical cross-section of the third encapsulation layer F3 may include an arc-shaped slope AR. One end of the arc-shaped slope may be coplanar with a boundary of the first region A. Along a direction oriented from the boundary of the first region A to the inside of the first region A, a thickness of the third encapsulation layer F3 in the location of the arc-shaped slope AR may gradually increase.

In the disclosed fabrication method, during the process of thinning the third layer, the etching gas may also have an etching effect on the third layer. Under the action of the etching gas, the third encapsulation layer F3 formed after being thinned may naturally form the arc-shaped slope AR at the boundary of the first region A. The thickness of the third encapsulation layer F3 may gradually decrease in a direction oriented toward the boundary of the first region A to form a slope-like structure, i.e., the arc-shaped slope AR.

Because the vertical cross-section of the third encapsulation layer F3 includes the arc-shaped slope AR, the transition of the encapsulation layer at the boundary of the first region A may be substantially smooth. In the subsequent fabrication processes, when binding the electronic component to the pad P, the reliability of the binding process may be improved, and a binding failure caused by a large segment difference in the encapsulation layer may be avoided. Moreover, because the reliability of the binding process is improved, an excessive region between the pad P and the first region A may not desire to be reserved, which may facilitate reducing a width of the frame of the display panel and implementing a narrow frame effect.

In one embodiment, the third encapsulation layer F3 may be made of an inorganic material. A length of the arc-shaped slope AR is L1, a height thereof is H1, where $300 \leq L1/H1 \leq 600$. In one embodiment, $L1/H1=450$.

Figure 16:
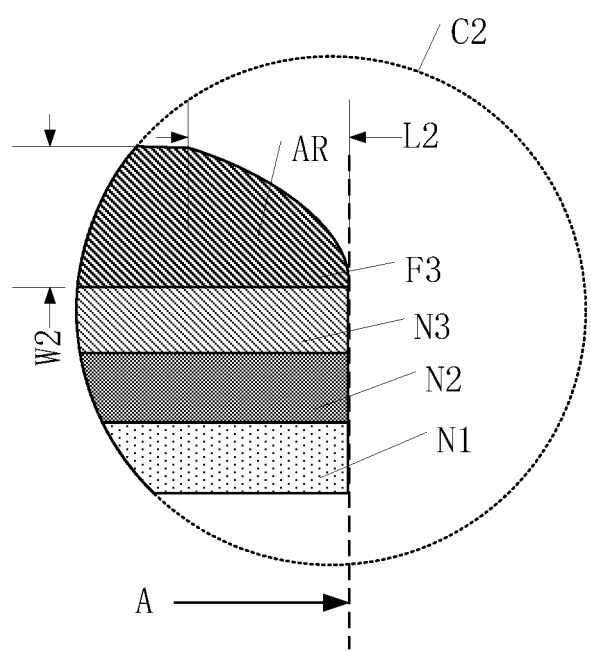
FIG. 16 illustrates an exemplary local zoom-in view of region C2 in FIG. 11 consistent with disclosed embodiments of the present disclosure.

In certain embodiments, the third encapsulation layer may be made of an organic material. FIG. 16 illustrates a local zoom-in view of region C2 in FIG. 11. In one embodiment, referring to FIG. 11 and FIG. 16, in the disclosed fabrication method, the third encapsulation layer F3 may be made of an organic material. A thickness of the film layer made of an organic material may be often substantially thick. A length of the arc-shaped slope is L2, a height thereof is H2, where $80 \leq L2/H2 \leq 120$.

The length and height of the arc-shaped slope AR may be related to various factors, e.g., the material of the third encapsulation layer F3, the thickness, the composition of the etching gas, the period of the dry etching, etc. The values of L1/H1, L2/H2 provided in the disclosed embodiments are merely for illustrative purposes.

The present disclosure also provides a display panel. Referring to FIG. 7 and FIG. 15, the display panel may include a substrate 100 provided with a light-emitting device EL; a first inorganic encapsulation layer N1, a second inorganic encapsulation layer N2, and a third encapsulation layer F3.

The first inorganic encapsulation layer N1 may be disposed on a side of the light-emitting device EL. A region where the first inorganic encapsulation layer N1 is located may define a first region A. The second inorganic encapsulation layer N2 may be disposed on a side of the first inorganic encapsulation layer N1 away from the light-emitting device EL. The second inorganic encapsulation layer N2 may be disposed in the first region A. The third encapsulation layer F3 may be disposed on a side of the second inorganic encapsulation layer N2 away from the light-emitting device EL. The third encapsulation layer F3 may be disposed in the first region A.

A vertical cross-section of the third encapsulation layer F3 may include an arc-shaped slope AR. One end of the arc-shaped slope AR may be coplanar with a boundary of the first region A. Along a direction oriented from the boundary of the first region A to the inside of the first region A, a thickness of the third encapsulation layer F3 in the location of the arc-shaped slope AR may gradually increase.

The disclosed display panel may be formed by any one of the above disclosed fabrication methods. The third encapsulation layer F3 may be made of an organic material, or an inorganic material, which is not limited by the present disclosure. The vertical cross-section of the third encapsulation layer F3 may have the arc-shaped slope AR, thus, the transition of the third encapsulation layer F3 at the boundary of the first region A may be substantially smooth. In the subsequent fabrication processes, when binding the electronic component to the pad P, the reliability of the binding process may be improved, and a binding failure caused by a large segment difference in the encapsulation layer may be avoided. Moreover, because the reliability of the binding process is improved, an excessive region between the pad P and the first region A may not desire to be reserved, which may facilitate reducing a width of the frame of the display panel and implementing a narrow frame effect.

In the disclosed display panel, any other suitable film layer structure may be disposed between the first inorganic encapsulation layer N1 and the second inorganic encapsulation layer N2, or between the second inorganic encapsulation layer N2 and the third encapsulation layer F3, which is not limited by the present disclosure.

In certain embodiments, referring to FIG. 7 and FIG. 15, in the disclosed display panel, the third encapsulation layer F3 may be made of an inorganic material. A thickness of the film layer made of the inorganic material may be often substantially thin. A length of the arc-shaped slope AR is L1, a height thereof is H1, where $300 \leq L1/H1 \leq 600$.

In certain embodiments, referring to FIG. 11 and FIG. 16, in the disclosed display panel, the third encapsulation layer F3 may be made of an organic material. A thickness of the film layer made of an organic material may be often substantially thick. A length of the arc-shaped slope is L2, a height thereof is H2, where $80 \leq L2/H2 \leq 120$.

In one embodiment, referring to FIG. 7 and FIG. 14, in the disclosed display panel, edges of orthogonal projections of the first inorganic encapsulation layer N1, the second inorganic encapsulation layer N2 and the third encapsulation layer F3 on the substrate 100 may overlap with each other.

In the fabrication process of the disclosed display panel, the first inorganic encapsulation layer N1 and the second inorganic encapsulation layer N2 may be formed by a dry etching process using the third layer as the second mask. The dry etching process may also thin the third layer itself to form the third encapsulation layer F3. Therefore, the edges of the first inorganic encapsulation layer N1, the second inorganic encapsulation layer N2, and the third encapsulation layer F3 may be flush.

It can be understood by those skilled in the art that in the dry etching process, there may be a certain process error. There may be a certain deviation between the edges of the first inorganic encapsulation layer N1, the second inorganic encapsulation layer N2 and the third encapsulation layer F3, and the deviation may be within an allowable range of process error.

In the disclosed display panel and fabrication method thereof, on the one hand, the first inorganic material layer may be first thinned to form the first inorganic layer. The substantially thin first inorganic layer may facilitate improving the bending property thereof and preventing the appearance of cracks.

On the other hand, the third layer may be formed in the first region. The first inorganic layer and the second inorganic layer may be etched using the third layer as the second mask. The first inorganic layer in the first region may be retained to form the first inorganic encapsulation layer. The second inorganic layer in the first region may be retained to form the second inorganic encapsulation layer. Thus, the quantity of masks may be saved, which may facilitate reducing cost.

Further, on the other hand, while patterning the first inorganic layer and the second inorganic layer by the dry etching, the third layer may be thinned by the etching gas. After thinning the third layer, the third encapsulation layer may be formed. The substantially thin third encapsulation layer may facilitate improving the bending property thereof and preventing the appearance of cracks.

In the disclosed display panel, the thickness of each encapsulation layer may be substantially thin, such that the display panel may have desired bending resistance, and the display quality and reliability may be improved.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments illustrated herein but is to be accorded the widest scope consistent with the principles and novel features disclosed herein.

What is claimed is:

1. A fabrication method for forming a display panel, comprising:
   providing a substrate disposed with a light-emitting device;
   forming a first inorganic material layer;
   forming a first inorganic layer by thinning the first inorganic material layer;
   forming a second inorganic layer;
   forming a third layer, wherein the third layer is disposed in a first region; and
   patterning the first inorganic layer and the second inorganic layer by a dry etching using the third layer as a mask, while simultaneously thinning the third layer, wherein:
   the first inorganic layer in the first region is retained to form a first inorganic encapsulation layer,
   the second inorganic layer in the first region is retained to form a second inorganic encapsulation layer, and
   the third layer is thinned to form a third encapsulation layer.

2. The fabrication method according to claim 1, wherein: the third layer is made of an inorganic material.

3. The fabrication method according to claim 2, wherein forming the third layer includes:
   forming a third material layer, and
   patterning the third material layer using a first mask, wherein the third material layer in the first region is retained to form the third layer.

4. The fabrication method according to claim 1, wherein: the third layer is made of an organic material.

5. The fabrication method according to claim 4, wherein forming the third layer includes:
   printing the organic material in the first region by inkjet printing to form the third layer.

6. The fabrication method according to claim 1, before forming the third layer, further including:
   forming a third inorganic material layer; and
   forming the third inorganic layer by thinning the third inorganic material layer,
   wherein:
   patterning the first inorganic layer and the second inorganic layer by the dry etching using the third layer as the mask, while simultaneously thinning the third layer includes:

patterning the third inorganic layer, the first inorganic layer, and the second inorganic layer by the dry etching using the third layer as the mask, while simultaneously thinning the third layer, wherein the third inorganic layer in the first region is retained to form a third inorganic encapsulation layer.

7. The fabrication method according to claim 6, wherein:
the third layer is made of an organic material, wherein the fabrication method further includes:
forming a fourth inorganic encapsulation layer on a side of the third layer away from the substrate.

8. The fabrication method according to claim 6, wherein:
the third layer is made of an inorganic material, wherein before forming the third layer, the fabrication method further includes:
forming a first organic encapsulation layer by printing the organic material in the first region by inkjet printing, wherein the first organic encapsulation layer is disposed on a side surface of the third inorganic encapsulation layer away from the substrate.

9. The fabrication method according to claim 1, wherein:
the display panel includes a display region and a non-display region that are predetermined,
the non-display region includes a binding region,
the substrate further includes a plurality of pads, wherein the plurality of pads are disposed in the binding region, and
the binding region is disposed outside the first region.

10. The fabrication method according to claim 1, wherein:
the first inorganic encapsulation layer is made of a material including one or more of silicon nitride and silicon oxide, and
the second inorganic encapsulation layer is made of a material including alumina.

11. The fabrication method according to claim 2, wherein:
the third layer is made of a material including silicon oxynitride.

12. The fabrication method according to claim 1, wherein:
the substrate further includes at least one blocking part, and
a blocking part of the at least one blocking part has an annular shape and is disposed around the light-emitting device, wherein the blocking part is disposed within the first region.

13. The fabrication method according to claim 1, wherein:
a vertical cross-section of the third encapsulation layer includes an arc-shaped slope,
an end of the arc-shaped slope is coplanar with a boundary of the first region, and
along a direction oriented from the boundary of the first region to inside of the first region, a thickness of the third encapsulation layer in a location of the arc-shaped slope gradually increases.

14. The fabrication method according to claim 13, wherein:
the third encapsulation layer is made of an inorganic material, and
a length of the arc-shaped slope is L1, and a height of the arc-shaped slope is H1, wherein $300 \leq L1/H1 \leq 600$.

15. The fabrication method according to claim 13, wherein:
the third encapsulation layer is made of an organic material, and
a length of the arc-shaped slope is L2, and a height of the arc-shaped slope is H2, wherein $80 \leq L2/H2 \leq 120$.

* * * * *